(12) United States Patent
Robertson (10) Patent No.: US 7,873,886 B2
(45) Date of Patent: Jan. 18, 2011

(54) PC-CONNECTIVITY FOR ON-CHIP MEMORY

(75) Inventor: Iain Robertson, Bedford (GB)

(73) Assignee: Texas Instruments Incorporated, Dallas, TX (US)

( * ) Notice: Subject to any disclaimer, the term of this patent is extended or adjusted under 35 U.S.C. 154(b) by 1143 days.

(21) Appl. No.: 11/537,798

(22) Filed: Oct. 2, 2006

(65) Prior Publication Data

US 2007/0089002 A1 Apr. 19, 2007

(30) Foreign Application Priority Data

Sep. 30, 2005 (GB) ................... 0519984.9

(51) Int. Cl.
*G01R 31/28* (2006.01)
(52) U.S. Cl. .................. 714/726; 714/727; 714/729
(58) Field of Classification Search ............. None
See application file for complete search history.

(56) References Cited

U.S. PATENT DOCUMENTS 5,347,523 A 9/1994 Khatri et al.
6,691,268 B1 2/2004 Chin

FOREIGN PATENT DOCUMENTS

EP 1117100 A1 7/2001
JP 03103778 A 4/1991

*Primary Examiner*—Cynthia Britt
*Assistant Examiner*—Guerrier Merant
(74) *Attorney, Agent, or Firm*—Lawrence J. Bassuk; W. James Brady; Frederick J. Telecky, Jr.

(57) ABSTRACT

An interface for converting a traditional scan-chain interface into one where locations in the scan-chain can be read or written to from an addressed interface is provided. The interface of the invention includes a scratch pad memory into which the values at the locations in the scan-chain are copied. Those copies in the scratch pad can be read and written to using an addressed interface and if any are changed the values held in the scratch pad are shifted out to update those in the original locations in the scan-chain.

27 Claims, 5 Drawing Sheets

PC-CONNECTIVITY FOR ON-CHIP MEMORY

This invention relates to the configuration of integrated circuits.

BACKGROUND

Application Specific Integrated Circuits (ASIC) are Integrated Circuits (IC's) which are designed and manufactured to perform a specific function. ASIC's are typically constructed by selecting standard circuit blocks (macros) for inclusion in an IC and interlinking them such that the overall IC performs the required function. Due to this use of a library of standard building blocks the cost of, and time required for, designing an ASIC to perform a specific function are greatly reduced.

Macros are designed to perform a specific task, however to minimise the number of variants of a given macro it is desirable to provide the ability to configure that macro. In this way a single macro design can be used to perform a number of (related) functions. This is desirable since the design and testing of a macro is highly time consuming and expensive and having to carry out this process for each minor variation would defeat the objective of using an ASIC.

To enable macros to be configured for each specific application they are generally designed to have a number of configuration inputs. When produced as an integrated circuit (IC) these inputs are routed to the relevant nodes in the macro, which can be provided with signals from other units within the IC or from the circuit board on which the IC is mounted. The configuration of the macros is therefore controlled by the design of the circuit board, or by values written to the circuit, which provide the required configuration logic levels for the macros to perform their required function.

A drawback to this method of configuration is that the configuration inputs to a macro increase the number of configuration connections to that macro (and possibly the overall pin count of the IC). The number of parameters in each macro that require configuration rapidly increases as the functionality of the macro increases and so the count of inputs required to perform that configuration also increases rapidly. Providing these configuration inputs and pins affects the cost and complexity of as IC's.

There is therefore a need for a system for configuration which reduces the number of configuration inputs required.

Macros are generally equipped with a set of registers that are used for testing the ASIC or for its configuration. These registers are connected in series in a shift register arrangement and form a so-called 'scan-chain'. Test or configuration values can be provided to the registers by shifting them along the scan-chain and the state of a macro can be read out by shifting values out along the scan-chain.

For configuration purposes the relevant registers of the scan-chain have outputs so connected to circuitry in the macro as to effect the desired change in configuration. For testing, the relevant registers are connected to provide or sample the levels at key nodes of the circuitry, which frequently are signal inputs or outputs to the macro that are provided for the macro's intended function in the ASIC. (Such scan testing can also be used at the circuit board level to ensure connections between ICs on the circuit board are correct, since the inputs and outputs of a macro may be at the boundary of an IC—this form of testing has been standardised in the J-TAG testing standard.)

The scan-chain is provided with a common clock signal. On each tick of the clock signal each register of the scan-chain passes its contents to the next register in the chain. Data presented at the input to the scan-chain is therefore clocked along the chain of registers until it gets to the last register in the chain from where it is passed back out of the chain. A scan-chain can be constructed from a number of macros in a single IC, or of macros in multiple ICs.

As described above, it is possible and known to utilise registers in the scan-chain to configure a macro. To do this the configuration data is presented at the input to the scan-chain in the correct order and the scan-chain clocked the correct number of times so that the data arrives at the required registers. Since it is not generally possible to control different parts of a scan-chain within a macro independently the data is latched into all of the registers simultaneously in a macro and all of the registers in a macro must therefore be programmed at the same time. This means that whatever method is used to program the registers it must take into account the purpose of all the registers in a macro and provide suitable values for them all, even if their values are not changed by the configuration.

Since access to a given register in the scan-chain is by sequential transfer of data along the chain, as opposed to direct access to a register, it is necessary to assemble all of the values into the correct order, which requires knowledge of both the length of the registers within a macro and their order in the scan-chain. All of this is inconvenient if it is desired to change the value of just one or a few of the registers.

SUMMARY OF THE INVENTION

The present invention provides an interface comprising:

an addressed interface for receiving addresses from external circuitry and for exchanging data associated with those addresses with the external circuitry, a scan-chain interface having a scan-chain data output and a scan-chain data input, and a memory comprising a plurality of memory elements, wherein the memory contains a plurality of addressable locations, each comprising one or more of the memory elements and each addressable location corresponding to its own one of address values receivable by the addressed interface, and wherein the addressed interface is connected to transfer data between a said addressable location in the memory and the external circuitry when the addressed interface receives the address corresponding to that location, wherein the memory also has a plurality of register copy locations, each comprising one or more of the memory elements, and the scan-chain interface is connected to receive data from the scan-chain data input and store it in register copy locations respective to registers of the scan-chain and to output data from the register copy locations to the scan-chain data output to the respective registers of the scan-chain, and wherein at least some of the addressable locations have at least one memory element that is comprised in a register copy location.

The interface may include an address calculator connected to provide the register copy location at which a scan-chain datum is to be stored.

The scan-chain interface preferably comprises a shift register having a scan input connected to receive data from the scan-chain input, the shift register being connected to transfer its data to the memory.

The scan-chain interface preferably comprises an adapter connected to control the shift register to shift in data via its scan input and to select a location in the memory in which to store a set of data from the shift register.

The interface preferably comprises a multiplexer connected to receive in parallel at its inputs data from a location of the memory selected by the adapter and connected to send that data from its output to the scan-chain output, the adapter being connected to control the multiplexer to serially output at least part of that data input to the multiplexer.

Alternatively, the shift register may have a scan output connected to send data via the scan-chain output, and the adapter may be connected to transfer data from a location of the memory selected by the adapter to the shift register and to control the shift register to send at least part of that data from its scan output.

The scan-chain interface may comprise a shifter connected between the shift register and the memory to shift data being transferred from the shift register to the memory by an amount determined by the adapter so as to justify the data to one end of the location in the memory to which the data is being transferred.

The scan-chain interface may comprise a masking means connected between the shift register and the memory to mask out a number, determined by the adapter, of the bits of the data being transferred from the shift register to the memory.

The adapter may be configured to load at least part of the shift register with a predefined value before data is shifted in from the scan-chain.

The interface may comprise control registers accessible via the addressed interface connected to control the operation of the scan-chain interface.

The control registers may include a register indicating whether the scan-chain interface should read data from or write data to the scan-chain.

The control registers may include a register that when written to causes the scan-chain interface to begin a read or write operation on the scan-chain.

The control registers may include a register indicating, for the case where the scan-chain has bypassable sections, which such section or sections is to be read from or written to by the scan chain interface.

Preferably, the memory is so organised and connected to the scan-chain interface and the addressed interface that the locations selected in the memory by the scan-chain interface are the same locations as those selected by the addressed interface.

In one embodiment, the interface comprises a scan-chain definition memory containing information concerning the organisation of registers in the scan-chain and the scan-chain interface is configured to arrange the data received from the scan-chain into locations of the memory in accordance with that information.

The scan-chain definition memory preferably contains information concerning the grouping of registers of the scan-chain into fields and the scan-chain interface is responsive to that information to arrange accordingly data from the scan-chain for different fields into different locations in the memory.

The scan-chain interface may be configured, if a field provides data that is longer than a location in the memory, to arrange that data into a plurality of locations.

The scan-chain interface may be configured to determine a block size for a field as being an integer power of two that is either equal to, or is the smallest power of two greater than, the number of locations required to store the data of the field and to store the data for that field in a block of locations of that size.

The scan-chain interface may be configured to store the field in a block beginning immediately after an integer multiple of blocks of that size from the beginning of a portion of the memory allocated to storage of fields.

The interface may comprise a scan-chain definition memory containing information about bypassable sections in the scan-chain.

The scan-chain interface may be configured to unbypass a selected bypassable section and read the data from it into the memory.

The scan-chain interface may be configured to determine the number of bypassable sections in the scan chain and to compare that with the number indicated by the information in scan-chain definition memory.

The scan-chain interface may be configured to determine the number of registers in a selected bypassable section and to compare that with the number indicated by the information in scan-chain definition memory.

The addressed interface may comprise a converter connected to receive the addresses and data in a serial addressed format and to convert those for use by the addressed interface.

The interface may comprise a multiplexer connected to allow access to the scan chain by other circuitry bypassing the interface itself.

The present invention also provides an integrated circuit comprising an interface comprising:
   an addressed interface for receiving addresses from external circuitry and for exchanging data associated with those addresses with the external circuitry,
   a scan-chain interface having a scan-chain data output and a scan-chain data input, and
   a memory comprising a plurality of memory elements,
   wherein the memory contains a plurality of addressable locations, each comprising one or more of the memory elements and each addressable location corresponding to its own one of address values receivable by the addressed interface, and wherein the addressed interface is connected to transfer data between a said addressable location in the memory and the external circuitry when the addressed interface receives the address corresponding to that location,
   wherein the memory also has a plurality of register copy locations, each comprising one or more of the memory elements, and the scan-chain interface is connected to receive data from the scan-chain data input and store it in register copy locations respective to registers of the scan-chain and to output data from the register copy locations to the scan-chain data output to the respective registers of the scan-chain,
   and wherein at least some of the addressable locations have at least one memory element that is comprised in a register copy location,
   the integrated circuit further comprising circuitry connected to the addressed interface of the interface and a scan-chain connected to the scan-chain interface of the interface.

The present invention further provides a method of accessing registers in a scan-chain comprising:
   providing a memory,
   copying the values of the registers of at least part of the scan chain to the memory in a predetermined manner,
   accessing an addressed location in the memory containing the value of at least one of the registers to retrieve that value,
   writing a new value to an addressed location in the memory containing the value of at least one of the registers, copying the values of the registers in the memory back to the original registers in the scan chain.

DESCRIPTION OF THE FIGURES

Preferred embodiments of the invention will now be described with reference to the accompanying Figures, of which.

DETAILED DESCRIPTION

The current invention provides a system for interfacing a scan-chain of registers to an addressed communications port to enable convenient access to those registers, for example for configuration of macros. The invention may be provided as part of an integrated circuit, and can be implemented as a macro.

Figure 1:
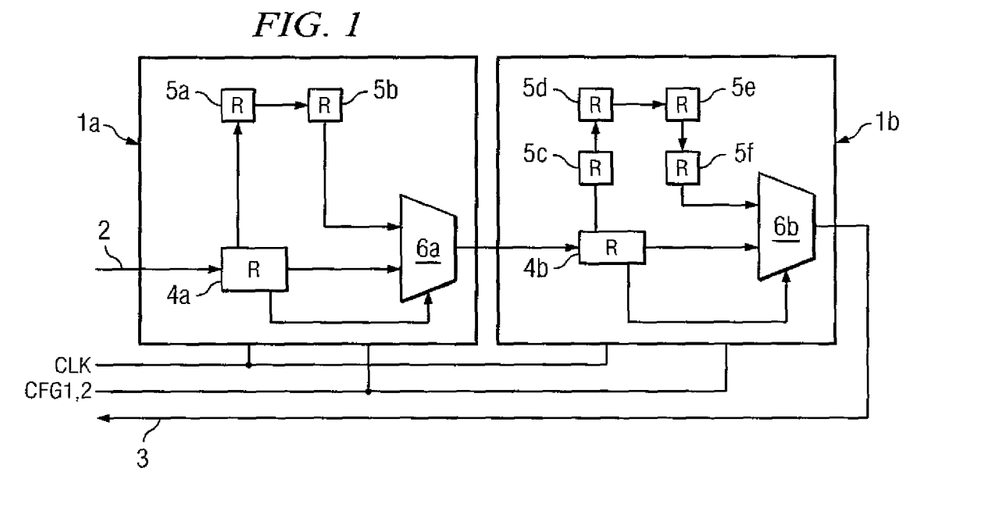
FIG. 1 shows two macros joined in a scan-chain.

FIG. 1 shows a schematic diagram of two macros 1a, 1b each having a number of registers 5a-f connected into a scan-chain. The scan-chain has an input 2 and an output 3. A common clock signal CLK and two control signals CFG1, CFG2 are connected in parallel to each of the macros, which signals control the operation of the scan-chain. Thus this exemplary scan-chain is typical of those known in the art, however, the invention is not limited to use with this example.

Each macro also has connected in the scan-chain a 1 bit bypass register 4a, 4b. By default, each macro is in the bypassed condition, in which data passed along the scan-chain passes only through that bypass register and not through the other registers of the macro and the macro therefore has a scan-chain length of 1. The bypass registers, 4a and 4b, also function to control the connection of the scan-chain within the respective macro. When a defined value is passed to a bypass register and a capture command (see below) is issued (via the CFG1 and CFG2 signals) the scan-chain of that macro is unbypassed such that all of the registers in that macro (including the bypass register 4a, 4b) are connected to the scan-chain. Therefore, when un-bypassed the macro 1a would have a scan-chain length of 3 and the macro 1b would have a scan-chain length of 5.

The bypass register remains in the scan-chain when a macro is unbypassed and a macro can be bypassed by shifting a defined value into that register 4a, 4b and issuing a capture command and when subsequently data is shifted along the scan-chain it passes through the macro 1a via the bypass register 4a only (i.e. omitting the registers 5a and 5b or 5c to 5f). Alternatively, a macro can be bypassed by issuing a reset command, via the configuration signals which rests all macros into the bypass mode. A multiplexer 6a, 6b is provided in each macro to select whether the scan-chain output of the macro is from the registers 5 or the bypass register (i.e. to select whether it is bypassed or not) which multiplexer is controlled by the bypass register. Registers in a scan-chain are preferably, and in the present example, of the shadowed type, in which each register comprises a scan register which is connected in the scan-chain and a shadow register which is connected to the circuitry of the macro. It is the value in the shadow register that controls, or indicates, the actual state of the macro. Upon a capture command being received by a macro (if that macro is unbypassed) the value in the shadow register is transferred to the scan-register so that it can be read out, and the value in the scan register is transferred to the shadow register. This structure of scan and shadow registers allows data to be clocked through the scan-chain without affecting the behaviour of the macro as the shadow registers (which control the behaviour) are not altered by a scan, changing only upon a capture command. With this arrangement clocking data through the scan-chain clearly does not affect the state of the macro.

As mentioned above data is passed along the scan-chain under control of a common clock signal (CLK) and common configuration (CFG) signals instruct the scan-chain registers to perform specific functions.

Specific commands provided by the CFG signals are:—

| | |
|---|---|
| Reset | Places all macros into the bypassed state. |
| Capture | The purpose of this command depends upon the state of the macro.<br>Macro bypassed - This command causes the value in the bypass register to be checked and if it is of the predefined value which indicates an unbypass instruction the macro is unbypassed.<br>Macro unbypassed - This command causes values from the shadow registers to be captured by the scan registers 5a–5f for shifting out along the scan-chain and, in the same operation, the values previously shifted into the scan registers 5a–5f to be copied to the shadow registers. |
| Shift | Causes the contents of each register to be passed along the chain, under the control of the clock signal. |

The process of reading the contents of a macro (in particular, for example, macro 1a) out of the output 3 will now be described with reference to Table 1, which shows the contents of the scan registers at each location 4a, 5a, 5b and 4b after successive numbers of shift signals (0-5).

| | Clock ticks | | | | | | | | |
|---|---|---|---|---|---|---|---|---|---|
| | 0 | 1 | 2 | 3 | 4 | 5 | 6 | 7 | 8 |
| | | | | | Node | | | | |
| CFG mode | Shift | Shift | Shift | Capture | Capture | Shift | Shift | Shift | Reset |
| 2 | 0 | 1 | X | X | X | X | X | X | X |
| 4a | X | 0 | 1 | 1 | 1 | X | X | X | 0 |
| 5a | X | X | X | X | A | 1 | X | X | X |
| 5b | X | X | X | X | B | A | 1 | X | X |
| 4b | X | X | 0 | 0 | 0 | B | A | 1 | 0 |
| 3 | X | X | X | X | X | 0 | B | A | 0 |

Initially the input signal 2 to the scan-chain is set to '0' and a first shift signal (CLK) is issued to move to state 1, thereby transferring the input signal, '0', to register 4a. Next the input signal is set to '1' and a shift signal is issued transferring the '1' to register 4a and the 0 to register 4b. A capture command is then issued (i.e. with the CFG1 and CFG2 signals), which unbypasses macro 1a due to the presence of the '1' in the bypass register 4a. Macro 1b is unaffected as it has a '0' in its bypass register and remains bypassed.

A further capture command is then issued which causes scan registers 5a and 5b to read values A, B from the shadow registers of their macros. Since macro 1b is not bypassed only its bypass register is affected and that register still contains a '0' so no action is taken Successive shift signals (states 3, 4 and 5) then cause the contents of the scan registers 5a and 5b to be shifted along the scan-chain 5a-5b-4b and to the output 3.

Write operations are performed in a similar way except that after unbypassing the required macro successive shift instructions are issued as the data is presented at the input and data is therefore shifted through the scan-chain to the required registers. Shifted-in data is then applied to the shadow registers of the macro when a capture command is issued.

Although the above procedures enable data to be read from and written to the registers of the macros, they have the difficulties, noted above, which make reading or writing just one of the registers 5 (or indeed just a few of many such registers) highly inconvenient.

Figure 2:
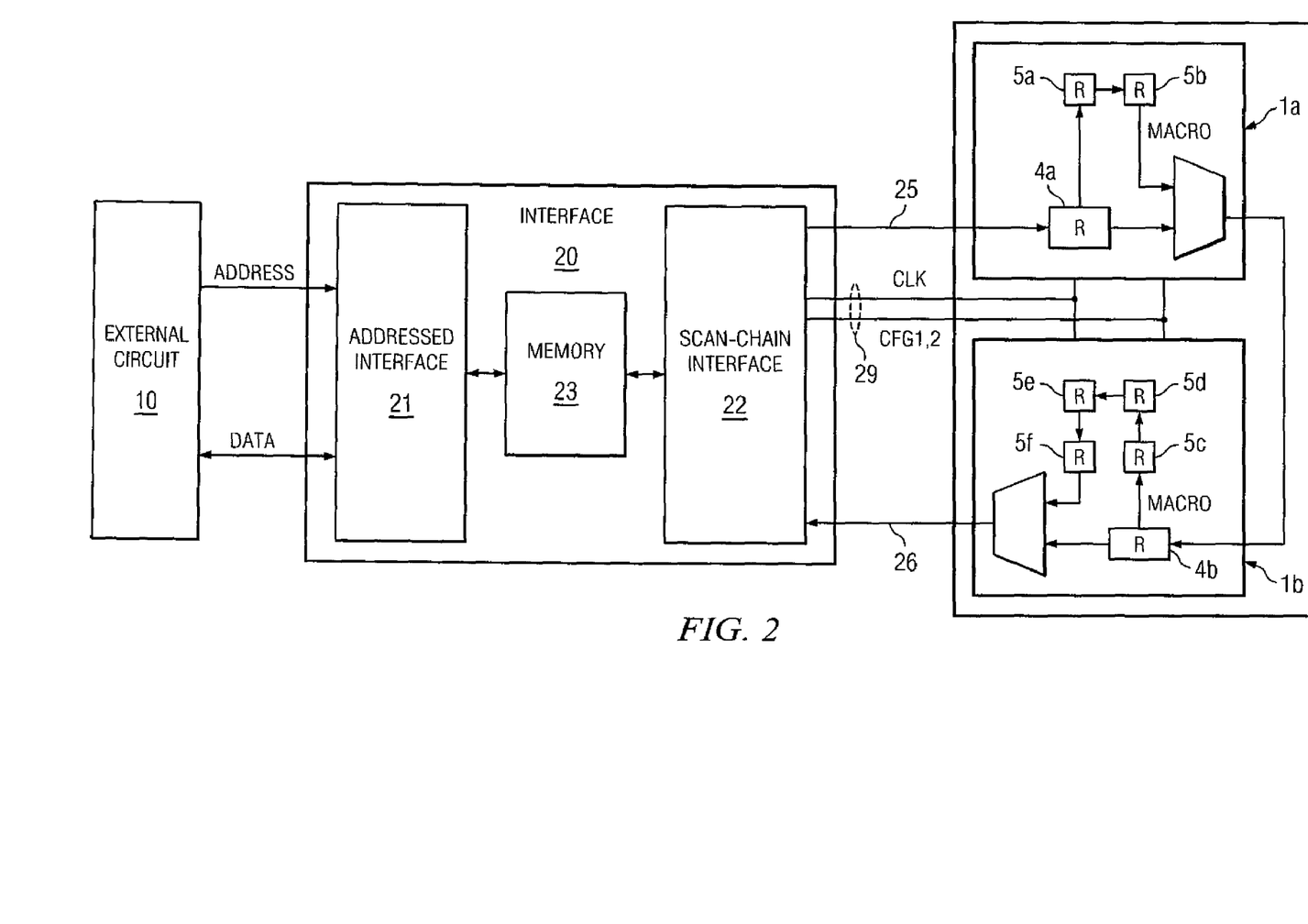
FIG. 2 shows an interface according to the present invention.

FIG. 2 shows a system according to the present invention which provides an interface to a scan-chain of a set of macros.

The interface 20 has an addressed interface 21 for accepting, from external circuitry 10, an addressed communications protocol. As such the addressed interface 21 accepts addresses identifying a location and accepts data to be written to that location or supplies data read from that location.

The interface 20 is also provided with a scan-chain interface 22, which provides a scan-chain output port 25 and a scan-chain input port 26 for connection to a scan-chain. The scan-chain interface 22 also provides outputs 29 for signals for controlling the scan-chain, which in the example of the scan-chain given above are the CLK and CFG signals, which are connected in parallel to each macro.

The interface 20 accepts read and write instructions from the external circuitry and executes those, in general providing a mechanism for reading any requested data from the scan-chain and passing it to the external circuitry 10 and for writing data provided by the external circuitry back to the scan-chain.

The instructions received on the addressed interface 21 are, in effect, addressed by the external circuitry to particular registers 5a to 5f (or as preferred sets thereof) in the macros 1a, 1b that make up the scan-chain and the interface 20 accomplishes a conversion between that addressed protocol and the unaddressed system of the scan-chain. To do this the data read from the scan-chain and to be written to it is passed between the addressed interface 21 and scan-chain interface 22 via a memory 23 included in the interface 20.

Figure 3A:
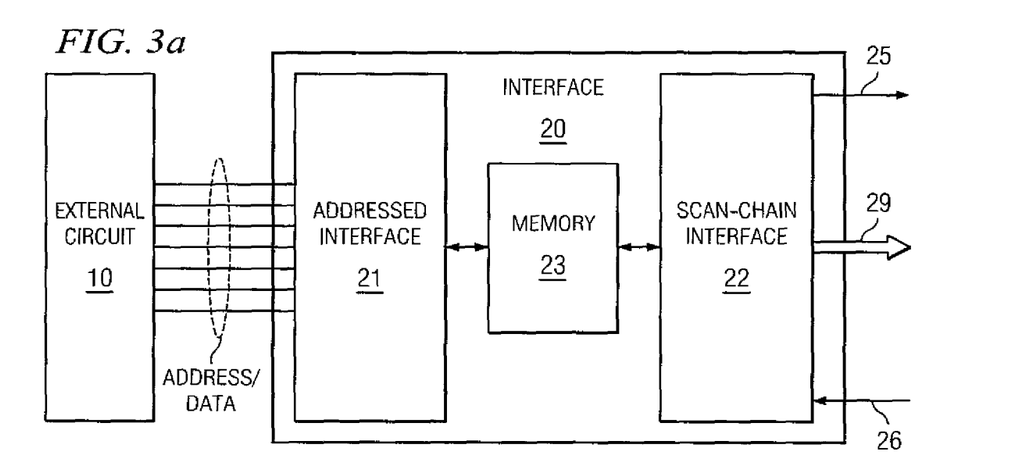
FIG. 3a shows the interface with a parallel port for its addressed interface.

Preferably, the addressed interface 21 has a parallel port for receiving the addressed requests from the external circuitry 10 as shown in FIG. 3a. As is known in the art the parallel port may have, for example, separate connections for address and data values or these can be multiplexed on the same set of lines. A parallel port is convenient if the external circuitry has an address and data bus(es).

Figure 3B:
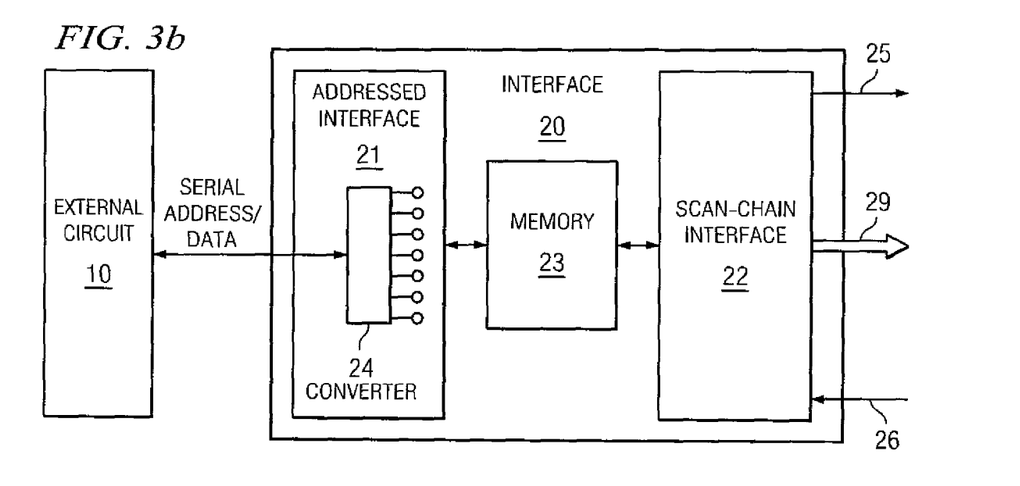
FIG. 3b shows the interface with a serial adapter provided for the addressed interface.

However, in ASICs and other ICs, serial addressed protocols such as MDIO or I²C are often used. In these protocols address and data values are sent down a serial link. As shown in FIG. 3b the addressed interface may include a converter 24 for converting a serial format to the preferred parallel format. (However addressed interface 21 may be provided in a form which uses the addressed serial protocol directly.)

The serial format may have a limited address space which may not be sufficient to provide access to the scratchpad—for example a typical scratch pad may require a 10-bit address, but MDIO only provides a 5-bit address space. To overcome this problem an indirect addressing system can be implemented in the converter such that a register is provided to hold the address to which access is required. This register can be written to by the serial format and the converter is configured to provide that data to the parallel interface as the address to which access is required. Further registers can be used to store the data being passed to or from the interface. (Conceivably a similar problem could exist for a parallel connection to interface 21—but this is unlikely—but the solution would be the same.)

The reading and writing of data via the interface 20 proceeds generally as follows. The scan-chain interface 22 first reads out data from the scan-chain using the process described above and places the values from its registers 5 into defined locations in the memory 23, which acts as a scratch pad or temporary copy of those values. The addressed interface 21 then allows the external circuitry 10 to read or write values from the scratch pad, the locations accessed in the memory being chosen in accordance with the address supplied by the external circuitry 10. The addressed interface may continue to read and write further values to the memory. This may be done at high speed since it is not necessary for each read or write to shift data through the scan-chain. Once a set of read or write operations has been made by the addressed interface 21, and if the set contained any write operations, the copy values of all the registers in the scratch pad (including of course the modified ones) are shifted back into the scan-chain and, once they are in their original positions, are written to its registers 5. In this way registers whose value was not changed in the scratch pad are rewritten with the values that they had previously and so are not disturbed.

In the examples below the scan-chain interface 22 generates addresses to control to which memory elements of the memory 23 values from the scan-chain are written and from which they are read. Conveniently the memory locations into which the memory elements of the memory 23 are organised and the address values assigned to each location by the addressed interface 21 and the scan-chain interface 22 are the same, but both the organisation into locations and address values may be different.

Further it is not necessary that the scan-chain interface 22 generate any addresses in order to access the memory 23; in one possible embodiment of the invention the memory elements of the memory 23 are joined in a shift register arrangement and data is shifted into that from the scan-chain input 26 and shifted out from it to the scan-chain output 25. In that embodiment the memory 23 still is still organised into locations that can be accessed by the addressed interface according to the addresses it receives from the external circuitry 10.

Preferably the memory 23 is large enough to hold the data for one of the macros 1 (the one with the largest number of registers). Alternatively the memory 23 may be large enough to hold register data from two or more, or all, of the macros 1 of the scan-chain.

Figure 4:
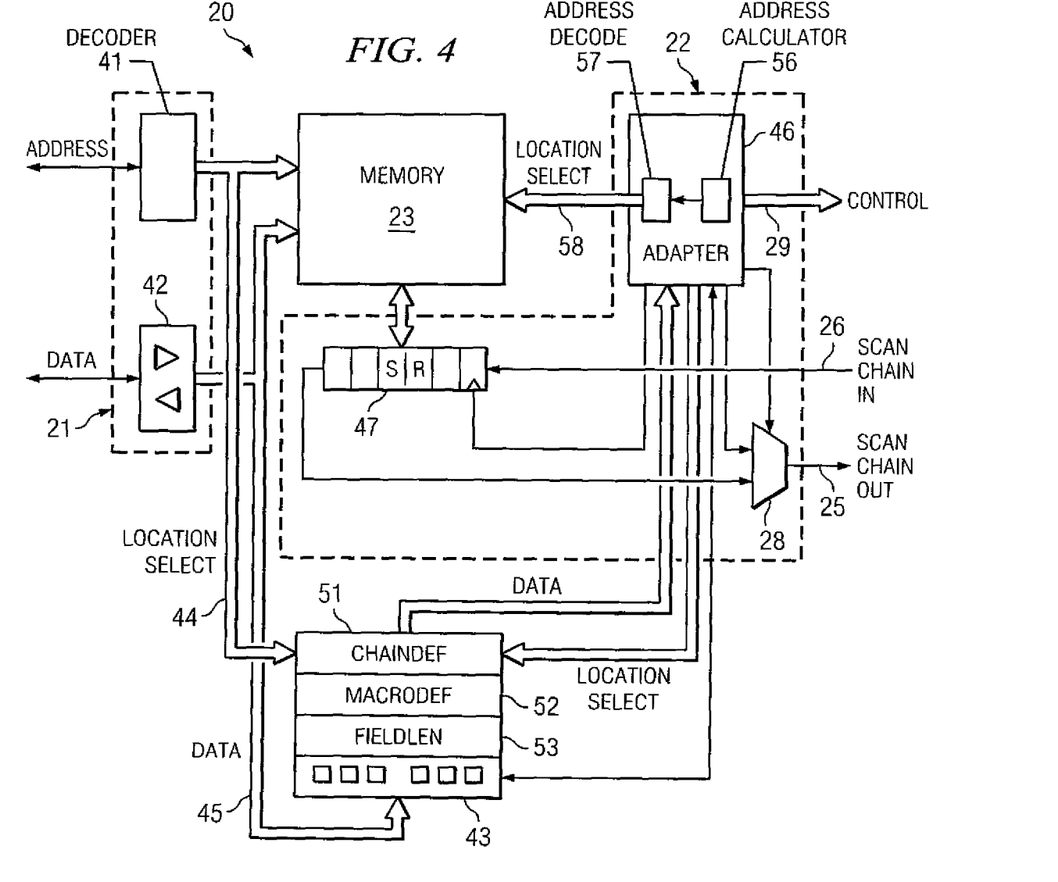
FIG. 4 shows details of an example of the interface.

FIG. 4 shows details of an example of the interface 20. In this example an additional memory area 43 is provided for control and status registers. These registers are accessible by the scan-chain interface 22 and can be written by the external circuitry 10 to control operations such as initiation of the reading and writing of the scratch pad from and to the scan-chain. Flags in the status registers allow the external circuitry 10 to obtain information about the progress and success of these operations. The control and status resisters are memory mapped (i.e. included in the address space provided to the external circuit by the addressed interface 21) for simplicity of connection, but could of course be provided with their own special inputs and outputs. The scratchpad memory 23 and register memory area 43 may be formed of a single section of memory, or as separate memory devices.

In this example the registers include a macro register for specifying which macro is to have its register values copied to the scratchpad, an instruction register for telling the interface 20 which function to perform and a start register for initiating an access to a macro.

The interface 20 operates as follows. An access of a macro is initiated by the external circuitry 10 writing an identity value for the required macro to the macro register via the addressed interface 21 and writing a read command to the instruction register. The start register is then set to instruct the scan-chain interface 20 to initiate the macro read operation. The macro identity may consist, for example, of a number indicating the macro's ordinal position in the scan-chain.

The scan-chain interface 20 functions to check the control registers and responds accordingly to carry out the process described above to read the required values from the scan-chain into the scratchpad 23. Once the data is present in the scratchpad a read complete status flag in area 43 is set to indicate that the action is complete (which may be monitored by the external circuitry by polling via the addressed interface 21) and the data is then available to be read via the addressed interface 21. If required, the data can be modified in the scratchpad by the external circuitry writing to addressed locations in the memory 23 via the addressed interface 21 and these are then written back to the macro by a subsequent write command being written by the external circuitry to the control registers of memory area 43.

Numerous circuits are known for reading and writing an addressed location. These typically comprise, as is shown for the address interface 21 in FIG. 4, an address decoder 41 and a data buffer 42. The address decoder takes the address supplied by the external circuitry 10 and places an active signal on a respective one (determined by the address value) of a respective memory location select lines 44. The selected location responds, depending on the operation being performed, by latching the value on the internal data bus 45 received from the external circuitry via buffer 42 or by writing its contents to that bus for transmission via the buffer to the external circuitry. As shown the control and status registers 43 are connected to the select lines 44 and the internal data bus 45 so that they can be read and written by the external circuitry 10 in the same way.

Preferably the memory 23 and the registers 43 are of SRAM construction and the address decoder and buffer may be provided by known circuits used for SRAM.

The scan-chain interface 22 is not of standard construction. In this example it comprises an adapter module 46 and a shift register 47. The shift register 47 is connected so that its scan output is connected to the scan-chain output 25 of the interface 20 and so that its scan input is connected to the scan-chain input 26 of interface 20. During a read, data from the macro registers 5 passes through the shift register 47. Each set of these values shifted into the shift register 47 are transferred, in turn, to a location in the memory 23, with the data in the shift register advancing the length of the shift register between each transfer. (This is the general method but see details below and FIGS. 7 and 8.) Conveniently the shift register length is equal to the length of a memory location. Addresses for these transfers are calculated by the adapter 46. This contains an address calculator 56 for the purpose and also an address decode 57 connected to convert the calculated address values and activate a corresponding one of a second set of location select lines 58 each connected to select a location in the memory 23.

Memory 23 is dual ported to allow simultaneous read operations by the addressed interface 21 and the scan-chain interface 22, but it does not allow simultaneous writes.

(As noted above the grouping of the memory elements into locations is conveniently, but not necessarily the same as is used by the addressed interface 21. Note also that while it is convenient for the transfer of the contents of the shift register to be to one location in the memory 23 different sections of the shift register could be transferred to respective locations.)

Similarly when the values in the memory 23 are to be rewritten to the scan-chain the adapter 46 selects locations in turn from the memory and transfers them to the shift register 47, advancing the data in the shift register the length of the shift register each time. The adapter generates the addresses in the same order as for the reading process so that the values in the memory 23 are returned to the same macro registers 5 as from whence they came.

Values for bypass registers are not stored in the memory. So during a read they are advanced right through the shift register without being transferred. On write back to the scan-chain bypass values are generated by the adapter 46 and are inserted (via multiplexer 28) into the appropriate positions in set of register values emerging from the shift register 47.

In a simple example the adapter simply increments the address it uses to select its locations in the memory 23 each time the shift register is filled. This uses the scratch pad quite efficiently but can mean that the external circuitry 10 is left (as will be seen from consideration of what follows later below) with the problem of sorting out different register 5 values that are placed in the same location in the memory 23. This happens because the length of the shift register 47, in most cases, will not or cannot match the organisation of the registers 5 in the macros 1.

The scan-chain can be (and is usually) formed of a collection of different macros, each of which is likely to contain a different number of scan-chain elements. The contents of the scan-chain and each macro will vary depending upon the particular application. Of particular importance is the number of registers in each macro, since this determines the length of the scan-chain, which information is needed by the adapter so as to know when to stop transferring data being shifted in from the scan-chain to the memory 23.

Preferably this information is pre-stored in the interface 20, but in another example it is discovered for itself by the controller unit 27 passing test patterns through the scan-chain (opening bypasses in turn, for example) during an initialisation process. The information can otherwise be pre-stored in the interface 20 by being built in at the design stage (since the macros being configured are likely to be on the same IC and so the information will be predetermined) or by being programmed through the addressed interface 21. It is also possible that the information be built-in but overwritable with new information provided by the external circuitry. This is particularly useful in cases where the length or composition of the scan-chain changes when the macro is reconfigured in a particular way.

In the more detailed example now given the registers within each macro are logically grouped into contiguous groups termed fields, for example a field of 8 registers could be utilised to provide an 8-bit number for configuration. In a typical macro there will often be a single general field comprising several disparate single bit control or status values, and also a number of fields of the same type, each relating to one of a plurality of similar sections in the macro, which fields may be one or more bits in length.

As an example of a typical macro (referred to below as macro A) consider a macro having a single, general, field of 38 bits and then four fields of 11 bits, each relating to one unit of a macro, which say, for example, each provide a separate communications channel for the IC.

As noted above the total length of the scan-chain is useful to the interface 20 so as to know when to stop the shift of data around the scan-chain. Information on the structure of the scan-chain needs to be available to the scan-chain interface 22, so that it knows how many shift instructions to issue to move the data to and from a specified macro. (It can also be made available to the external circuitry 10 via the addressed interface 21.)

The total length, and more, is, in the example of FIG. 4, provided by three sets 51, 52 and 53 of registers, which may be provided in the same section of memory as the memory area 43 that contains the control and status registers. These register sets 51, 52 and 53 contain a definition of the scan-chain (chaindef 51), of the fields within each macro in that scan-chain (macrodef 52) and of the size of each field (fieldlen 53). The structure of this representation of the scan-chain is shown below.

Chaindef—Defines Order of the Macros within a Chain
|mdefptr<n>| . . . |mdefptr<2>|mdefptr<1>|

| | |
|---|---|
| mdefptr<i> | Pointer to the macro definition location in memory area 52 which defines the macro in position <i> in the chain. Four mdefptr are stored in each location in memory area 51. |

Macrodef—Defines the Fields within a Macro

Base definition (utilised when the macrodef location is pointed to by an mdefptr<i> register):
|Flenptr1|Repeat1|flenptr0|extn|
(The four values above occupy one location in the memory area 52.)

Extended definition (utilised when indicated by the extn field of a macrodef register of the base type):
|Flenptr<i+1>|Repeat<i+1>|Flenptr<i>|Repeat<i>|
(The four values above occupy one location in the memory area 52.)

| | |
|---|---|
| Extn | Defines the number of additional macrodef locations provided to define the macro. The subsequent locations are of the extended type. |
| Flenptr | Pointer to the FieldLen register in the Fieldlen locations in memory area 53 defining the fields. |
| Repeat | Number of times to repeat the field defined by the register to which the respective Flenptr points (note that the field defined by flenptr0 does not have an associated repeat register and so only one occurrence of that field is possible). |

Fieldlen—Defines the Number of Bits in Each Field.
|Flen|

Flen Defines the number of bits in a field. (One Flen occupies all of a location in memory area 53.) As is known in the art, a number of encoding formats are possible. Preferably 8 bits are used to represent the numbers 1-255 and a separate zero flag is used to indicate zero.

The use of these three levels of registers allows a high degree of flexibility in the range of macros and fields which can be correctly defined, without the need for large amounts of storage space. Other methods of representing the scan-chain could alternatively be used.

Figure 5:
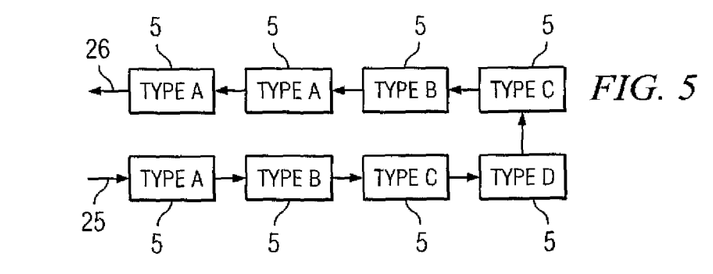
FIG. 5 shows a scan chain having macros of different types, FIG. 6 figuratively illustrates a representation used in the interface of FIG. 4 of the scan-chain of FIG. 5.

This representation is further explained with reference to an exemplary scan-chain shown in FIG. 5 in which a chain of 8 macros, of four different types, are connected to the interface.

Figure 6:
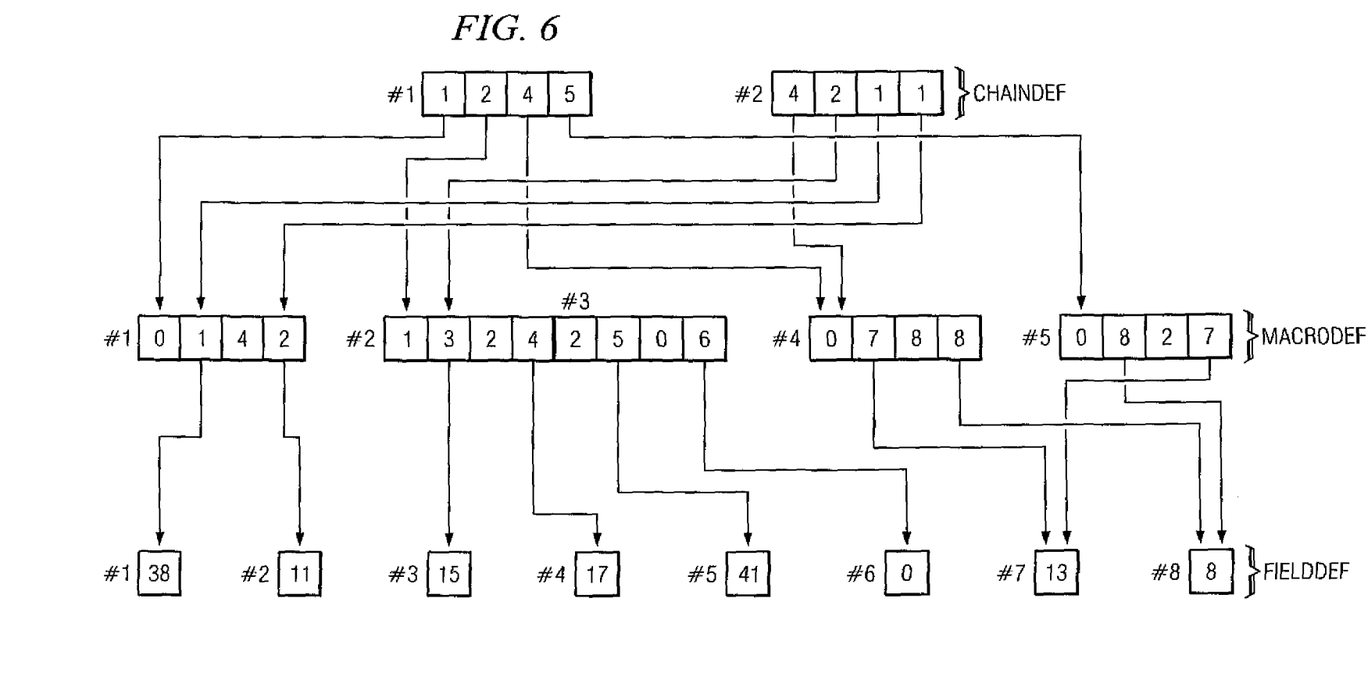

Macro type A has a field structure as described above—one general field of 38 bits and four fields of 11 bits each. FIG. 6 figuratively shows the register structure used to define the scan-chain shown in FIG. 5 with arrows showing pointers.

The chaindef locations (two, #1 and #2) define the type of macro at each position in the chain by pointing to a macrodef location which describes the details of that type of macro.

Turning to the macrodef locations, macro type A is defined in macrodef location #1 as pointed to by the first entry in location #1 of the chaindef register #1.

The extn field of macrodef location #1 is set to zero so that only that location is used in the definition. The flenptr0 entry indicates that the first field of the macro is defined by the Flen location #1, which shows that the field has a length of 38 bits. The repeat1 entry shows that the field defined by the pointer in the flenptr1 entry should be repeated 4 times. Flenptr1 points to flen location #2, which shows a field length of 11 bits.

The second macro in the chain is of type B and the second entry in the chaindef location #1 points to the macrodef location #2. In this case the extn field is set to 1 and so one additional macrodef location (#3), of the extension type, is also used to define macro type B. The flenptr0, repeat1 and flenptr1 fields in the first half of the location function in the same manner as above. However, the macro type B further comprises the fields defined in the extended location #3. As can be seen this macro therefore also comprise two repetitions of a 41 bit field, defined by the flen location #5.

The final repeat of macrodef location #3 has a repeat value of zero and points to a flen location (#6) with a value of zero. These indicate that no further register exists in macro type B and the entry is therefore ignored.

The definition continues in this manner until the end of the scan-chain is reached after the 8$^{th}$ macro and the whole scan-chain is defined. Further chaindef locations can, of course, be utilised if the scan-chain is longer than 8 macros.

As described above, to access the scan-chain the contents of a macro (or macros) are copied into the scratchpad 23, for subsequent access via the addressed interface 21. In order that particular fields of a macro can be accessed there is a defined method of arranging the fields into the scratchpad.

The data read from the macro via scan-chain input port 25 is a contiguous set of data and so could be stored in this fashion in the scratchpad as noted in the simple example given earlier.

As noted above a macro may have a number of fields of the same type, each of which fields will relate to the same property of a different part of the macro. For example a SerDes (serialiser-deserialiser) may have one general field and then four fields each relating to one channel of the device. It is convenient if the related fields are arranged in the scratch-pad in a logical organised fashion, since they will then appear in a logical organised fashion when being accessed via addressed interface 21. In this example the location of each field in the scratchpad is determined from the definition locations 51, 52, 53 in the interface 20 described above.

Figure 7:
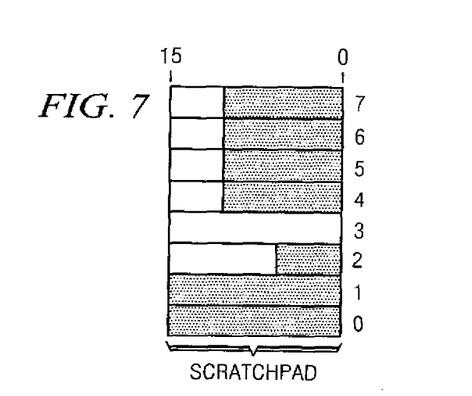
FIG. 7 shows a memory map example for the scratchpad of the interface of FIG. 4.

FIG. 7 shows an example memory map in the scratchpad 23 for a macro of the type A, discussed above, which has one field of 38 general bits and four fields of 11 bits of the same type (each, for example, referring to one of the channels of the device). Shaded areas indicate those areas occupied with bits from the macro.

Fields are arranged by the adapter 46 into the scratch-pad according to two rules:
- A field is allocated a block of locations of size equal to the next power of two above the number of locations required to store that field. In the example each location stores 16 bits and so a 17 bit field would be allocated a block of 2 locations, and a 33 bit field would be allocated a block of 4 locations.
- Blocks must start at a location which sits on a boundary for blocks of that size. For example, boundaries for blocks of 4 locations lie between locations #3 and #4, #7 and #8 and so on (the location addresses start at zero).

Adapter 46 controls the advancement of the shift-register 47 and the transfer operations, calculating the address of the locations to be used in accordance with these rules.

These rules are now explained further in relation to the storage of two macros in the scratchpad.

FIG. 7 shows a memory map for a macro of type A discussed above. Shaded areas are areas in which fields are stored, and un-shaded areas are not used.

In macro A the first field has a length of 38 bits and can, therefore, fit into the first three locations of the scratchpad (there being 16 bits per location). However, 3 locations is not a power of two, and so the field is allocated a block of 4 locations, which is the next power of two above 3. The field is therefore stored in locations #0, #1, and #2 with location #3 forming part of the block but being empty.

The second field has a size of 11 bits and so will fit into a single location. The field will be stored in location #4 since that is the first free location above the previous field (location #3 is allocated to the first field's block) and location #4 lies on a boundary for blocks of 1 location (in fact, all locations lie on such a boundary).

The next three fields are then stored in locations #5, #6 and #7 according to the same rules.

Figure 8:
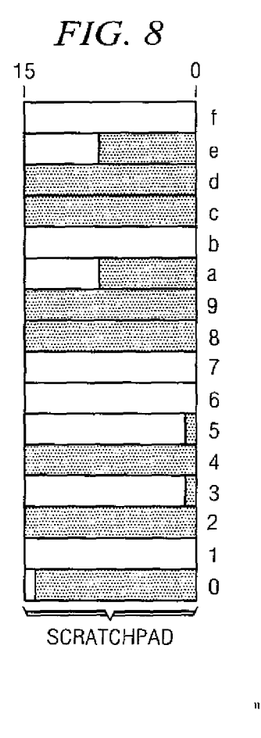
FIG. 8 shows another memory map example for the scratchpad of the interface of FIG. 4.

FIG. 8 is a more complicated example of mapping fields into the scratchpad.

In this case the first field is of size 15 and so is allocated a block of one location, at location zero.

The second field is of 17 bits, and so requires a block of two locations. The first free location is location #1, but that does not lie on a boundary for blocks of two locations. The next such boundary occurs between locations #1 and #2 and so the second field is stored starting at location #2.

The third field is again of 17 bits and so requires a block of two locations. The next free location is location #4, and that lies on a boundary for blocks of two locations and so the field is stored in locations #4 and #5.

The fourth field is of 41 bits and so requires 4 locations. The next available location which starts at a boundary for blocks of 4 locations is location #8. The field is therefore stored starting at location #8.

The same operation then leads to the final field of 41 bits having a block of four locations starting at location #C (12 in decimal notation).

In this manner the fields can be stored in an easily accessible format in which the address of a given part of any field can easily be calculated.

Data is stored in the locations by transfer from the shift register 47 to the defined location, which is selected by the adapter 46 performing the address calculations and activating the corresponding select line. In the case of a field which is longer than one location, the first 16 bits are shifted into the shift register and transferred to the location. The shift register is then clocked the required number of times to shift the data for the next location into the shift register and this is then transferred to the next location.

Since the fields are arranged according to this predetermined method, the adapter can calculate the location of the fields in the scratchpad from knowledge of the fields within a given macro. (Note that since only one macro is stored in the scratchpad at a time, knowledge of the arrangement of the scan-chain is not required, only of the given macro.)

The method also ensures that two or more fields of a macro are not included in the same location in the memory 23, which simplifies access via the addressed interface 23. The address of any field to be used when accessing via the addressed interface 23 is also easily calculated by this method, either by the designer of the external circuitry or on the fly by that circuitry. Also since repeated fields are spaced regularly in the address space of addressed interface 21 the address of any particular one is easily calculated, again either by the designer of the external circuitry or on the fly by that circuitry.

If a field does not fill a whole location (ie. is less than 16 bits) but the whole contents of the shift register are transferred to the scratchpad then the unused areas of the location will be populated with a random arrangement of data (ie. that data in the part of the shift register unused by the field being stored). Whilst this does not prevent correct operation of the system, it is good practice for unused storage areas to contain a defined value (typically zero). This is achieved by masking the bits from the shift register 47 as they are transferred to the memory 23.

The mask is generated by reference to the number of bits remaining in the field. (Adapter 46 keeps track of the number of bits required by decrementing the flen value.)

In one arrangement the remaining bits are shifted through the shift register until they are the oldest bits in the shift register. The mask then has its '1's in the oldest positions and they correspond in number to the number of bits in the field.

If a field is longer than 16 bits then no mask will be required when a full set of bits are being written. Once the full-locations have been written, a mask is generated for the final location, which will only be partly occupied, according to the method described above.

Within a field (ie. if it is too long to fit into one location of memory 23) the address provided by adapter 46 to select the location in memory 23 is incremented by one each time another portion of the field is shifted into the shift register. Between fields the address provided by adapter 46 to select the location in memory 23 is calculated according to the above rules defining the storage of the fields.

It is possible to move fields, or portions of a field, that are less than sixteen bits to either the newest or oldest end of the shift-register 47. In this example they are moved to the oldest end. (For tidiness of organisation in the memory space of addressed interface 21 these portions, on transfer to the memory, are moved to the least significant bits of the location to which they are being transferred.) When those bits are transferred back to the shift-register they are replaced into the oldest end of the shift register. This may write junk data into the newer end of the shift register (or zero's if a mask employed) but this does not matter as this data is not clocked out of the shift register and is overwritten by the next transfer from the memory.

An alternative solution, which avoids the need to calculate a mask is described below.

When a field of less than the shift register length (or part of a field) is to be transferred to the scratch pad, the shift register is firstly filled with zeros. As the data is moved into the shift register it is justified to the newest end of that shift register—ie. clocking is stopped once the last bit is just in the first register of the register. The shift register will therefore contain the data at the newest end of the shift register, with the remaining registers being populated with zeros. The whole 16-bits of the shift register is then be transferred to the defined location and any unused areas of the location will be populated with zeros. Thus the masking effect is achieved without the need to calculate and produce a mask.

As stated the above process requires the shifting of data into the shift register to be stopped while the shift register is loaded with zeros. To remove the need for this delay the transfer to the scratchpad can be made on the same clock cycle as the next bit is loaded into the newest bit of the shift register and as zeros are loaded into the 15 oldest bits of the shift register.

However, if this alternative method is utilised the data transfer from shift-register registers to bits in a location in memory 23 is not a direct mapping (since the scratchpad is preferably justified to the least significant end, but the shift register is justified to the newest end) and so a shifter for the data is provided to correctly align it. (If this mapping adjustment is not performed when the data is written to the scratchpad, it must be performed when the data is transferred out of the scratchpad otherwise the un-used parts of a location will be placed within the value of that field.)

Figure 9:
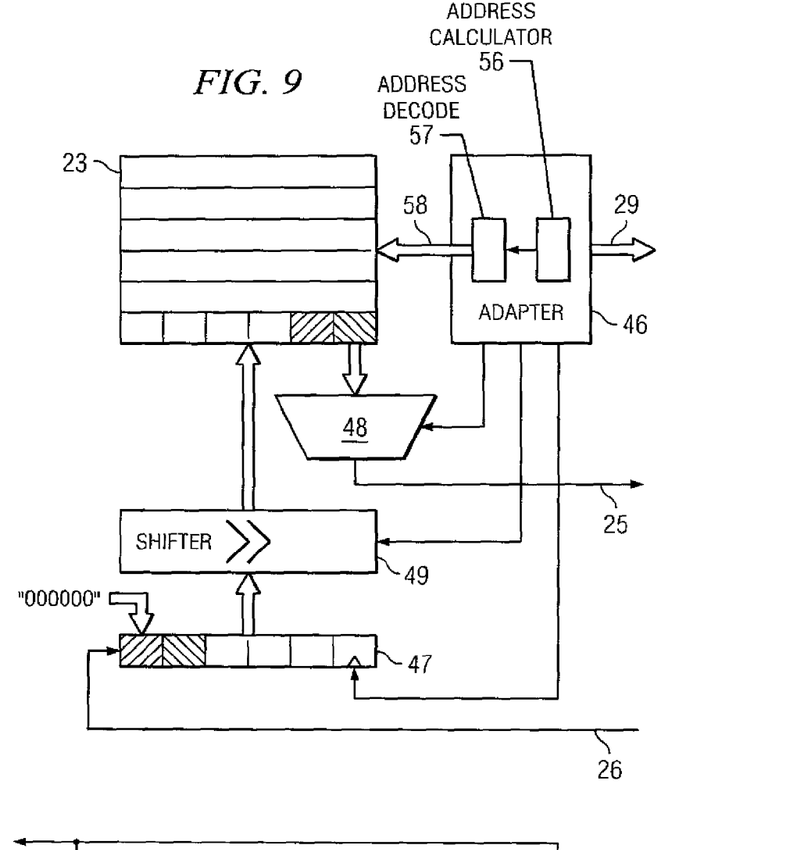
FIG. 9 is an alternative example for transferring data from the memory.

An alternative shift register arrangement is shown in FIG. 9. In this embodiment the scan-chain input 26 is connected to the scan-in port of the shift register 47 as before. However, the scan-chain output 25 is connected to the output of a selector multiplexer 48 whose parallel input is connected to parallel output of the scratchpad.

For transfer to the memory 23 a shifter 49 is provided to justify the data to the least significant bits of the memory 23 location. This is not essential but is a convenient to the external circuitry 20 when it accesses that data.

When it is required to transfer data back to the scan-chain the contents of the correct location (as calculated by the adaptor 46) is transferred to the multiplexer 48 from the scratchpad. The data is selected by the multiplexer being clocked (by the adapter 46) through the bits from the scratch pad which are then passed out to the scan-chain. This arrangement may be advantageous as it may be simpler to provide a multiplexer than a serial output on the shift register. Indeed some known memories have a nibble mode in which in response to receiving an address provide the or a subset of the bits at that location in turn at an output in serial form. Such a memory could therefore be used instead of memory 23 and multiplexer 48 (irrespective of whether known nibble mode memories utilise a multiplexer in the way shown in FIG. 8 to produce the function or otherwise).

Although not shown in FIG. 9 the shift-register in FIG. 9 could be replaced by using a memory for the scratchpad 23 that has an write nibble mode. In this version the scan chain input is connected to the nibble mode input of the memory and the adapter is arranged, following selecting each location using location select lines 58, to advance the bits along the scan chain and into the memory location at the rate expected by the nibble mode input.

In order to ensure that the interface 20 has information relating to the correct scan-chain, and that that scan-chain is operating correctly, the interface 20 provides two types of verification and methods.

Firstly the interface 20 can determine the length of the scan-chain in terms of the number of macros which are connected to it in order to check that that is correct.

To do this the adapter 46 first issues a reset command to the scan-chain so that all macros are bypassed. Then it shifts 'N' zero's into the scan-chain, where 'N' is the maximum permitted length of the scan-chain (all of the macros are in their normal, bypassed state, and so each has a length of 1), this will ensure that all of the scan-chain elements are populated with a zero. A stream of ones is then shifted by adapter 46 into the scan-chain, which then monitors the output of the scan-chain. By counting the number of ones shifted into the chain the length can be determined by the count when a one is first detected at the output of the chain. This is checked against the length of the scan-chain stored in chaindef 51 and an error indicated in a status register in memory area 43.

If 'N' ones are shifted into the chain before a one is detected at the output of the scan-chain the chain is either broken or too long for the interface, and again the adapter 46 indicates an error in a status register in memory area 43.

The adapter 46 then shifts zeros into the scan-chain and monitors the output for a zero. When that zero appears the number of shifts should be the same as the number of shifts required for a one to appear at the output—this acts as a verification of the first length calculation. If the number of shifts is different then there is a data-type dependent error in the scan-chain, and again the adapter 46 indicates an error in a status register in memory area 43.

In order to ensure that the scratchpad mapping will operate correctly the interface 20 can verify the length of the scan-chain within each macro 1.

Although the registers 5 within a macro are arranged into fields, as far as the scan-chain is concerned they are simply a series of single bits. There is therefore no way of determining where one field ends and the next begins. This means that the interface 20 cannot automatically discover the structure of a macro. However, the total number of registers (and hence bits) in each macro can be determined both from the scan-chain and the definition of it on memory areas 51, 52 and 53 and this provides a first-check of the configuration stored in the interface. If the configuration stored in memory areas 51, 52 and 53 is correct, the number of bits in each macro 5 should match the total of the field length values stored in memory area 53 for each macro in the chain.

To check this the adapter 46 unbypasses the first macro and shifts a series of zeros into the scan-chain. The number of zeros shifted into the scan-chain is be equal to the maximum size of the scratchpad since that is the maximum possible size of the scan-chain. The purpose of this is to ensure that all registers in the first macro contain a zero such that the test can start from a defined state. Ones are then shifted into the scan-chain, while counting through the fields defined by the relevant macrodef location(s). The output of the scan-chain should remain at zero until the end of the fields are reached. If a one is detected by the adapter 46 at the output before the end of the fields is reached then the length of that macro is shorter than specified.

Zeros are then shifted into the scan-chain. If on the first shift, a zero is still detected at the output of the scan-chain then the scan-chain is longer than that defined in the interface.

If either of these errors is detected a flag is set in memory area 43 to indicate that there is an error in the configuration and that operation is unlikely to be correct.

Adapter 46 then repeats the above process on each of the macros in the scan-chain to verify that the length of all of them is configured correctly.

Before the verification process the scratchpad 23 is cleared and while verification is taking place the data read back is stored into the scratchpad according to the usual mapping. At the end of the verification areas used to store data should therefore contain ones, and areas not used should contain zeros. This is therefore a useful method of verifying that the mapping to the scratchpad is as expected.

For some macros the scan-chain length is dependent upon the values stored in the registers on the scan-chain. Usually this is because it is possible for the scan-chain length to be changed by writing values to the scan-chain. If this is done the scan-chain definition stored in memory areas 51, 52 and 53 must be updated after the change to ensure that the correct configuration is always stored in the interface 20. In the example of FIG. 4 this update is left to the external circuitry, which writes the new values to memory areas 51 and 52 via addressed interface 21.

As has been discussed only one macro needs to be stored in the scratchpad 23 at any one time, however it may also be desirable to store all, or some, of the macros in the scratchpad at the same time. This is equally possible and simply requires a larger scratch-pad area. The mapping is performed in the same fashion as described above, but each macro's fields will be offset from the start of the scratchpad by the fields in the previous macros in the chain, preferably by a fixed value.

It has also been described above that the external circuitry is responsible for initiating the read and write back accesses of the scan-chain (e.g. by writing to the control register 43). It would also be possible to arrange to interface 20 to perform those actions automatically at appropriate times, which might be to read the scan-chain when a first read of memory 23 is made by the external circuitry and to write back to the scan-chain a defined period later.

It is common for customers to be supplied with a code file which define the macros using a hardware definition language such as Verilog. This enables the customer to perform the actual fabrication of the ICs depending upon their requirements. It is therefore possible to supply code defining the interface 20 which can be produced as part of the IC to interface to the macros on that IC.

Figure 10:
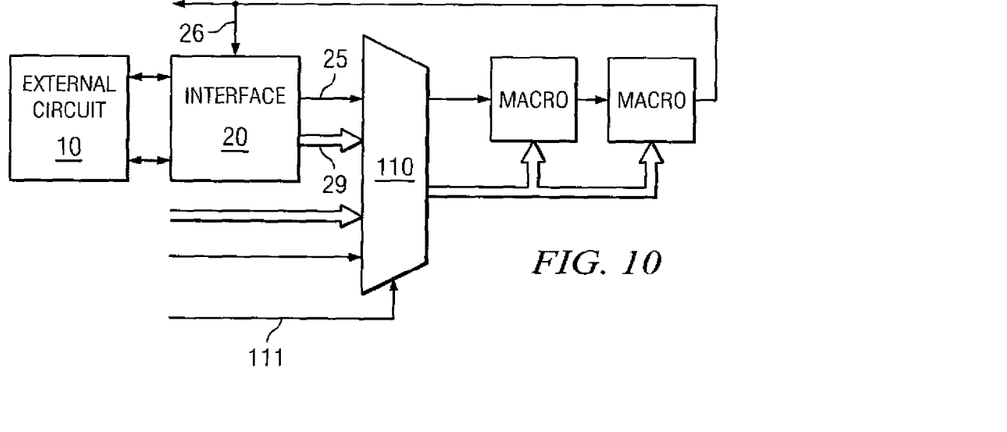
FIG. 10 shows a circuit for allowing test access to the scan-chain bypassing the invention.

FIG. 10 shows a further embodiment of the interface, including a multiplexer 110. The multiplexer allows either the interface 20 itself, or an external unit, to access the scan-chain. External access to the scan-chain may be required during production testing, for instance. A control line 111 is provided to select either the adapter or the external input to be connected to the scan-chain.

The invention claimed is:

1. An integrated circuit having interface circuitry comprising:
   A. an addressed interface having leads receiving addresses from external circuitry and for exchanging data associated with those addresses with the external circuitry,
   B. a scan-chain interface having registers, a scan-chain data output, and a scan-chain data input, and
   C. a memory having a plurality of memory elements,
      i. the memory containing a plurality of addressable locations, each including one or more of the memory elements and each addressable location corresponding to its own one of address values receivable by the addressed interface, the addressed interface being connected to transfer data between an addressable location in the memory and the external circuitry when the addressed interface receives the address corresponding to that location,
      ii. the memory also having a plurality of register copy locations, each including one or more of the memory elements, and the scan-chain interface is connected to receive data from the scan-chain data input and store it in register copy locations respective to the registers of the scan-chain and to output data from the register copy locations to the scan-chain data output to the respective registers of the scan-chain, and
      iii. at least some of the addressable locations have at least one memory element that is included in a register copy location.

2. An interface as claimed in claim 1 and including an address calculator connected to provide an address to determine the register copy location at which a scan-chain datum is to be stored.

3. An interface as claimed in claim 1 wherein the scan-chain interface comprises a shift register having a scan input connected to receive data from the scan-chain input, the shift register being connected to transfer its data to the memory.

4. An interface as claimed in claim 3 wherein the scan-chain interface comprises an adapter connected to control the shift register to shift in data via its scan input and to select a location in the memory in which to store a set of data from the shift register.

5. An interface as claimed in claim 4 comprising a multiplexer connected to receive in parallel at its inputs data from a location of the memory selected by the adapter and connected to send that data from its output to the scan-chain output, the adapter being connected to control the multiplexer to serially output at least part of that data input to the multiplexer.

6. An interface as claimed in claim 4 wherein the shift register has a scan output connected to send data via the scan-chain output, and the adapter is connected to transfer data from a location of the memory selected by the adapter to the shift register and to control the shift register to send at least part of that data from its scan output.

7. An interface as claimed in claim 4 wherein the scan-chain interface comprises a shifter connected between the shift register and the memory to shift data being transferred from the shift register to the memory by an amount determined by the adapter so as to justify the data to one end of the location in the memory to which the data is being transferred.

8. An interface as claimed in claim 4 wherein the scan-chain interface comprises a masking means connected between the shift register and the memory to mask out a number, determined by the adapter, of the bits of the data being transferred from the shift register to the memory.

9. An interface as claimed in claim 4 wherein the adapter is configured to load at least part of the shift register with a predefined value before data is shifted in from the scan-chain.

10. An interface as claimed in claim 1 wherein the interface comprises control registers accessible via the addressed interface connected to control the operation of the scan-chain interface.

11. An interface as claimed in claim 10 wherein the control registers include a register indicating whether the scan-chain interface should read data from or write data to the scan-chain.

12. An interface as claimed in claim 10 wherein the control registers include a register that when written to causes the scan-chain interface to begin a read or write operation on the scan-chain.

13. An interface as claimed in claim 10 wherein the control registers include a register indicating, for the case where the scan-chain has bypassable sections, which such section or sections is to be read from or written to by the scan chain interface.

14. An interface as claimed in claim 1 wherein the memory is so organised and connected to the scan-chain interface and the addressed interface that the locations selected in the memory by the scan-chain interface are the same locations as those selected by the addressed interface.

15. An interface as claimed in claim 1 comprising a scan-chain definition memory containing information concerning the organisation of registers in the scan-chain and the scan-chain interface is configured to arrange the data received from the scan-chain into locations of the memory in accordance with that information.

16. An interface as claimed in claim 15 wherein the scan-chain definition memory contains information concerning the grouping of registers of the scan-chain into fields and the scan-chain interface is responsive to that information to arrange accordingly data from the scan-chain for different fields into different locations in the memory.

17. An interface as claimed in claim 16 wherein the scan-chain interface is configured, if a field provides data that is longer than a location in the memory, to arrange that data into a plurality of locations.

18. An interface as claimed in claim 17 wherein the scan-chain interface is configured to determine a block size for a field as being an integer power of two that is either equal to, or is the smallest power of two greater than, the number of locations required to store the data of the field and to store the data for that field in a block of locations of that size.

19. An interface as claimed in claim 18 wherein the scan-chain interface is configured to store the field in a block beginning immediately after an integer multiple of blocks of that size from the beginning of a portion of the memory allocated to storage of fields.

20. An interface as claimed in claim 1 comprising a scan-chain definition memory containing information about bypassable sections in the scan-chain.

21. An interface as claimed in claim 20 wherein the scan-chain interface is configured to unbypass a selected bypassable section and read the data from it into the memory.

22. An interface as claimed in claim 20 wherein the scan-chain interface is configured to determine the number of bypassable sections in the scan chain and to compare that with the number indicated by the information in scan-chain definition memory.

23. An interface as claimed in claim 20 wherein the scan-chain interface is configured to determine the number of registers in a selected bypassable section and to compare that with the number indicated by the information in scan-chain definition memory.

24. An interface as claimed in claim 1 wherein the addressed interface comprises a converter connected to receive the addresses and data in a serial addressed format and to convert those for use by the addressed interface.

25. An interface as claimed in claim 1 comprising a multiplexer connected to allow access to the scan chain by other circuitry bypassing the interface itself.

26. An integrated circuit having an interface comprising:
A. an addressed interface having leads receiving addresses from external circuitry and exchanging data associated with those addresses with the external circuitry,
B. a scan-chain interface having registers, a scan-chain data output, and a scan-chain data input,
C. a memory having a plurality of memory elements,
  i. the memory containing a plurality of addressable locations, each including one or more of the memory elements and each addressable location corresponding to its own one of address values receivable by the addressed interface, the addressed interface is connected to transfer data between a said addressable location in the memory and the external circuitry when the addressed interface receives the address corresponding to that location,
  ii. the memory also having a plurality of register copy locations, each including one or more of the memory elements, and the scan-chain interface is connected to receive data from the scan-chain data input and store it in register copy locations respective to the registers of the scan-chain and to output data from the register copy locations to the scan-chain data output to the respective registers of the scan-chain, and
  ii. at least some of the addressable locations having at least one memory element that is included in a register copy location, and
D. a scan-chain connected to the scan-chain interface.

27. A method of controlling values contained in registers in a scan-chain comprising:
A. providing an addressable memory on the integrated circuit,
B. copying the values of the registers of at least part of the scan chain to the corresponding locations in memory,
C. reading an addressed location in the memory containing the value of at least one of the registers to retrieve that value,
D. writing a new value to an addressed location in the memory containing the value of at least one of the registers, and
E. copying the values of the registers in the memory back to the corresponding registers in the scan chain.

* * * * *